United States Patent [19]

Masleid et al.

[11] Patent Number: 5,045,913
[45] Date of Patent: Sep. 3, 1991

[54] BIT STACK COMPATIBLE INPUT/OUTPUT CIRCUITS

[75] Inventors: Robert P. Masleid, Austin; Parsotam T. Patel, Round Rock, both of Tex.

[73] Assignee: International Business Machines Corp., Armonk, N.Y.

[21] Appl. No.: 592,764

[22] Filed: Oct. 4, 1990

Related U.S. Application Data

[62] Division of Ser. No. 471,892, Jan. 29, 1990, Pat. No. 4,988,636.

[51] Int. Cl.[5] .................. H01L 27/02; H01L 27/10; H01L 29/34
[52] U.S. Cl. .................. 357/52; 357/23.13; 357/40; 357/45; 357/46
[58] Field of Search .................. 357/45, 23.13, 40, 46, 357/52

[56] References Cited

U.S. PATENT DOCUMENTS

| | | | |
|---|---|---|---|
| 3,798,606 | 3/1974 | Henle et al. | 340/172.5 |
| 3,968,478 | 7/1976 | Mensch, Jr. | 340/172.5 |
| 3,999,214 | 12/1976 | Cass | 357/45 |
| 4,006,492 | 2/1977 | Eichelberger et al. | 357/45 |
| 4,731,643 | 3/1988 | Dunham et al. | 357/68 |
| 4,746,966 | 5/1988 | Fitzgerald et al. | 357/68 |
| 4,766,475 | 8/1988 | Kawashima | 357/45 |

FOREIGN PATENT DOCUMENTS

| | | | |
|---|---|---|---|
| 0052828 | 7/1982 | European Pat. Off. | |
| 0170268 | 2/1986 | European Pat. Off. | 357/45 |
| 58-137229 | 8/1983 | Japan | 357/45 |
| 61-144843 | 7/1986 | Japan | 357/45 |
| 62-12147 | 1/1987 | Japan | 357/45 |

Primary Examiner—J. Carroll
Attorney, Agent, or Firm—Thomas E. Tyson

[57] ABSTRACT

In accordance with the teachings of this invention a method for positioning components of input/output circuits is provided. These components are positioned on a semiconductor substrate. The semiconductor substrate includes other than input/output circuits. Each input/output circuit is provided for processing a single bit of information within a data word containing multiple bits. The method includes the step of (1) dividing each input/output circuit into groups containing similar functional subcomponents; (2) forming a vertical column of subcomponents for each input/output circuit and connecting these subcomponents to perform the function; (3) placing said columns in adjacency to form a plurality of columns with like subcomponents immediately adjacent to each other forming row groups of said like subcomponents; and (4) forming guard rings around the subcomponent row groups if required. Also in accordance with this invention, a group of input/output circuits is provided. The group is positioned on an integrated circuit substrate that contains other than input/output circuits. The input/output circuits group includes a plurality of columns of circuitry component where each column represents all of the input/output circuit components for processing a single bit of information in a group of bits, a plurality of rows positioned across the columns containing like devices among said input/output circuits, and at least one guard ring containing at least one of the plurality of rows.

12 Claims, 9 Drawing Sheets

PRIOR ART

FIG. 3

GROUP IDENTICAL COMPONENTS

FIG. 4

STRETCH EACH COMPONENT INTO
VERTICAL STRING OF SUBCOMPONENTS
(OCD SHOWN)

**PACK HORIZONTALLY,
CUT TO CONVENIENT LENGTH**

BIT STACK COMPATIBLE INPUT/OUTPUT CIRCUITS

CROSS REFERENCE TO RELATED APPLICATION

This application is a division of application Ser. No. 07/471,892 filed Jan. 29, 1990, now U.S. Pat. No. 4,988,636.

TECHNICAL FIELD

This invention relates to data processing system integrated circuits and, more particularly, to integrated circuits containing input/output circuit elements.

BACKGROUND ART

Data processing systems consist of electronic components that are customarily fabricated in integrated circuits upon silicon chips. These integrated circuits include the transistor, resistor and capacitor elements required to perform the circuit functions The layout or arrangement of these circuit elements upon the silicon chip is critical in achieving high density circuitry arrangements on integrated circuits. Input/output circuits provide a special challenge in the layout of integrated circuits since it is the input/output circuits that provide the interface between the "outside world" and the internal integrated circuit chip functions.

One typical prior art approach to fabricating input/output circuits is termed the reserve cell approach. Examples of the "reserve cell approach" are illustrated in U.S. Pat. No. 4,731,643 and U.S. Pat. No. 4,746,966. According to the reserve cell technique, specific areas are set aside on the integrated circuit chip for the input/output circuits. Typically, these areas or cells are on the perimeter of the circuit chip since the input/output circuit connections to external circuits are traditionally on the edge of the integrated circuit chip. These areas are sufficient for the input/output circuit for the maximum anticipated function, including the drive, receive, pull-up and other circuit functions (each for the maximum device size). This number of reserved areas or reserved cells fixes the maximum number of input/output circuits permitted for the semiconductor chip design. Typically, a set of compatible circuit layouts are provided that implement each of the basic input/output functions required, such as the drive function, the receive function, etc. The designer would then select among these primitive layouts to construct the total function desired. These components would then be placed in their preplanned locations within the given input/output cell. Productivity with this method is usually excellent because each primitive function only needs to be laid out once. However, the resulting density of the integrated circuit design is poor for several reasons. First, input/output cells must be spaced apart from each other in anticipation of the worst possible neighboring circuit layouts. Second, specific space must be reserved in the cells for the largest anticipated specimen of each type of primitive input/output function. Third, any unused input/output cell space cannot be turned over to internal functional circuits because it is fragmented and, therefore, difficult to place or wire efficiently. Fourth, input/output circuit layouts are commonly coupled to the package connection pitch (or output pin pad connections). These input/output connection constraints often set the limit to input/output circuit density.

A second type of traditional approach to input/output circuit design for integrated circuits is termed the "integrated function" approach. The integrated function approach is actually a full custom design method. In other words, no specific area is set aside for the input/output circuits. Traditionally, the input/output circuits always appear upon the perimeter of the integrated circuit chip. Again, this is because the input/output circuits provide the interface to the "outside world" which means that the input/output circuits are connected directly to the external pad connections upon the perimeter of the chip. According to this method, a complete layout is done for each combination of input/output primitive functions. If, for example, one function had two driver types, two receiver types and a pull-up load resistance, as many as three times three times two or 18 layouts might be required. The number of layouts is further multiplied if various form factors are desired. For example, a form factor can be any one of the following: (1) a tall thin layout, (2) a square layout, (3) an "L" shaped layout or (d) two layouts: one for each orientation with respect to the wiring grid. The end result can be that every input/output circuit becomes a custom layout. This approach results in an integrated circuit design that can be very dense. However, the method is very labor intensive.

Both of the reserve space problems mentioned above for the reserve cell approach are eliminated with the integrated function approach since there are no input/output cells to reserve unused areas. However, achievable density is still limited because the circuits of one input/output circuit must still be spaced apart from circuits of other input/output circuits in anticipation of possible circuit interference (layout interference). A diffusion region connected to the outside must be widely separated from another diffusion of arbitrary type, possibly with a guard ring or two interposed. This is necessary to avoid latch-up. Packaging within a circuit is customized, but differing functions that have been packed side by side may result in form factor conflicts that also result in a loss of total density.

One type of technique that has been developed for integrated circuit layouts is termed "bit stack layout". According to the bit stack layout philosophy, the location of circuits is dictated by the wiring of those circuits Traditionally, integrated input/output circuits in bit stack configured semiconductor devices, are located on the peripheral of the chip. In small scale integrated circuit designs this was not a problem, since the edge of the chip was not far from any of the other circuits on the chip. However, in very large scale integration (VLSI), the edge is a distinct location different from the inside portions of the chip. However, the input/output functions have still been located at the edge because (1) the input/output circuits were close to the integrated circuit package connection pads, (2) busses that feed the input/output circuitry include the power busses which have traditionally been placed at the edge since they do not have to be fed through the internal circuitry, (3) in complimentary MOS integrated circuits, a parasitic effect termed "latch-up" exists and in order to protect the internal chips from latch-up the input/output circuits (which are more susceptible to latch-up due to the incoming voltage variances caused by the interconnection to the outside environment) are located such that they are spaced and isolated by guard rings from the internal circuits which has resulted in their placement at the edge, and (4) the input/output circuits are large and traditional packaging design dictates that the small circuits be placed together to reduce wire size and to place large circuits elsewhere.

An example of bit stack architecture is disclosed in U.S. Pat. No. 4,006,492 entitled, "High Density Semiconductor Chip Organization". This patent illustrates a semiconductor chip layout method that provides for plurality of logic cells that have been arranged in columns Another example is U.S. Pat. No. 3,999,214 entitled, "Wireable Planar Integrated Circuit Chip Structure", which shows circuit functions arranged in cells and the cells arranged in an orthogonal array of cells that are substantially parallel in both orthogonal directions. Another example is U.S. Pat. No. 3,798,606 which teaches a substrate providing electrical interconnection paths for several monolithic circuit modules, where each of the circuit modules is associated with distinct bits for data processing by internal circuitry. A further example is U.S. Pat. No. 3,968,478 entitled, "Chip Topography for MOS Interface Circuit". This patent teaches a partial custom layout of peripheral input/output circuits while illustrating internal circuit design using bit stack methodology. Japanese patent application 58-137229 entitled, "Semiconductor Device" (Abstract), illustrates a circuit layout that teaches a wiring optimization technique that teaches separate placement of input/output circuits.

Lastly, European Patent Application 0 052 828 illustrates internal circuits laid out in a bit stack structure, but also shows that the input/output circuits are arranged as reserved cells along the peripheral locations of the chip.

The above bit stack structure examples unanimously teach the layout of input/output circuits as non-integrated circuit elements and, further, provide for their location on the peripheral areas of the integrated circuit. It is the object of the present invention to provide for a method and layout of integrated input/output circuits that enhances the density of the integrated input/output circuits in the total integrated circuit chip layout.

DISCLOSURE OF THE INVENTION

In accordance with the teachings of this invention a method for positioning components of input/output circuits is provided These components are positioned on a semiconductor substrate. The semiconductor substrate includes other than input/output circuits. Each input/output circuit is provided for processing a single bit of information within a data word containing multiple bits. The method includes the step of (1) dividing each input/output circuit into groups containing similar functional subcomponents; (2) forming a vertical column of subcomponents for each input/output circuit and connecting these subcomponents to perform the function; (3) placing said columns in adjacency to form a plurality of columns with like subcomponents immediately adjacent to each other forming row groups of said like subcomponents; and (4) forming guard rings around the subcomponent row groups if required.

Also in accordance with this invention, a group of input/output circuits is provided. The group is positioned on an integrated circuit substrate that contains other than input/output circuits. The input/output circuits group includes a plurality of columns of circuitry component where each column represents all of the input/output circuit components for processing a single bit of information in a group of bits, a plurality of rows positioned across the columns containing like devices among said input/output circuits, and at least one guard ring containing at least one of the plurality of rows.

BRIEF DESCRIPTION OF THE DRAWING

The foregoing and other objects, aspects and advantages of the invention will be better understood from the following Best Mode for Carrying Out the Invention with reference to the figures listed below, in which.

BEST MODE FOR CARRYING OUT THE INVENTION

This invention relates to the layout of input/output circuits in a semiconductor device. As previously discussed, the objective of this invention is to provide a method for minimizing the surface area required for input/output circuits on the semiconductor device surface. The I/O circuit: (1) provides buffer/amplification to drive off-chip, (2) provides protection to internal circuits, (3) conditions incoming signal to create good electronic voltage levels to drive internal circuits and (4) isolates external world from chip to perform testing within chip. It should be understood that to properly utilize this invention, the integrated circuit being fabricated should contain a multiple of input/output circuits. In addition, this invention provides the greatest advantage to the large number of circuits that are being integrated on a single semiconductor substrate.

Figure 1A:
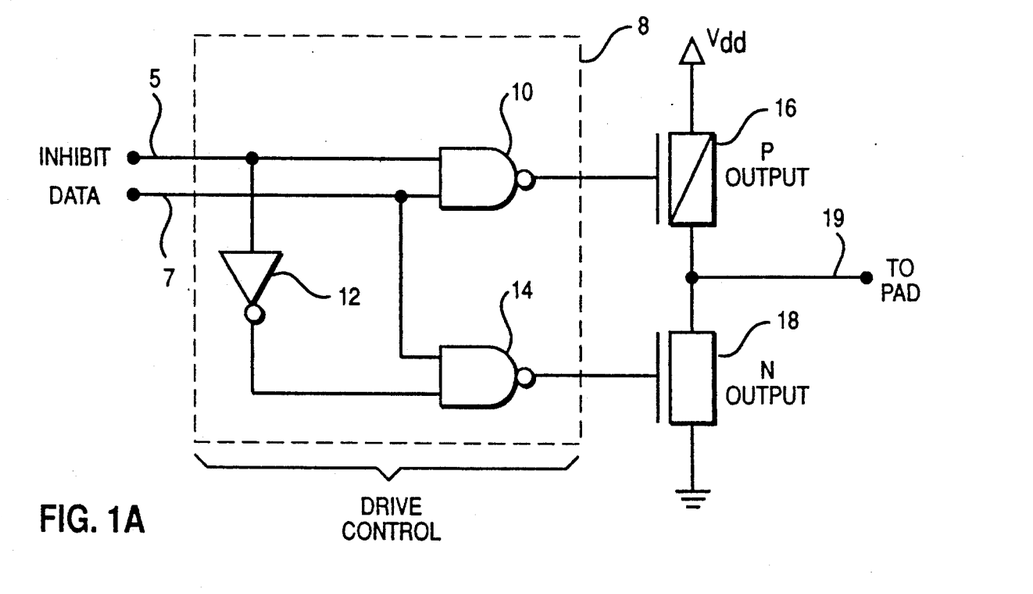
FIG. 1A is a schematic diagram of a drive circuit.
Figure 1B:
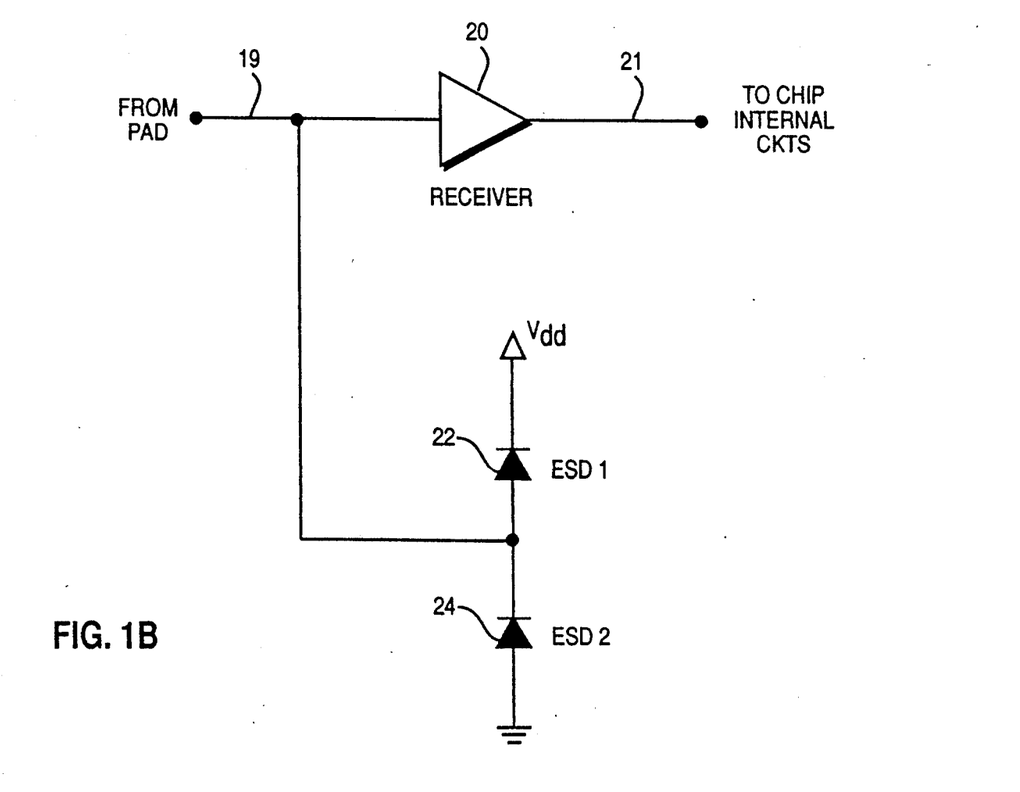
FIG. 1B is a schematic diagram of a receiver circuit.

FIG. 1a and FIG. 1b illustrate two portions of a input/output circuit. It should be understood that it is necessary in the layout of an integrated circuit chip to provide multiple of these types of input/output circuits. The specific circuits in FIGS. 1a and 1b are merely provided for example and the same methodology applied to these circuits may be applied to other input/output circuits. In FIG. 1a a drive control circuit 8 is comprised of two NAND gates 10 and 14 that are connected to an inhibit input 5 and a data input 7. Additionally, the inhibit input 5 is connected to an inverter 12 which is in turn connected to the input of NAND gate 14. The output of NAND gate 10 drives a P channel device 16. The output of NAND gate 14 drives the N channel device 18. The P channel device 16 is connected Vdd and the output 19 that will be provided to a pad or output pin from the integrated circuit device itself. Likewise, the N channel device 18 is connected between ground and the output 19. The P channel device 16 is a P channel field effect transistor. Likewise device 18 is an N channel field effect transistor.

FIG. 1a is another portion of the input/output circuit being fabricated. The pad providing the output signal in FIG. 1a is also connected to the circuit in FIG. 1b. A signal on line 19 is provided to a receiver circuit 20 which provides an output on line 21 to the internal circuits of the semiconductor device. Also, line 19 is connected to two diodes 22 and 24. Diode 22 is further connected to Vdd and diode 24 is connected to ground. The diodes 22 and 24 provide electrostatic discharge protection to the receiver 20. The circuits in FIG. 1a and 1b are fabricated together to provide a bidirectional input/output circuit. As discussed above, a multiple of these circuit types are used to provide input/output data flow for the integrated circuit chip.

Figure 2:
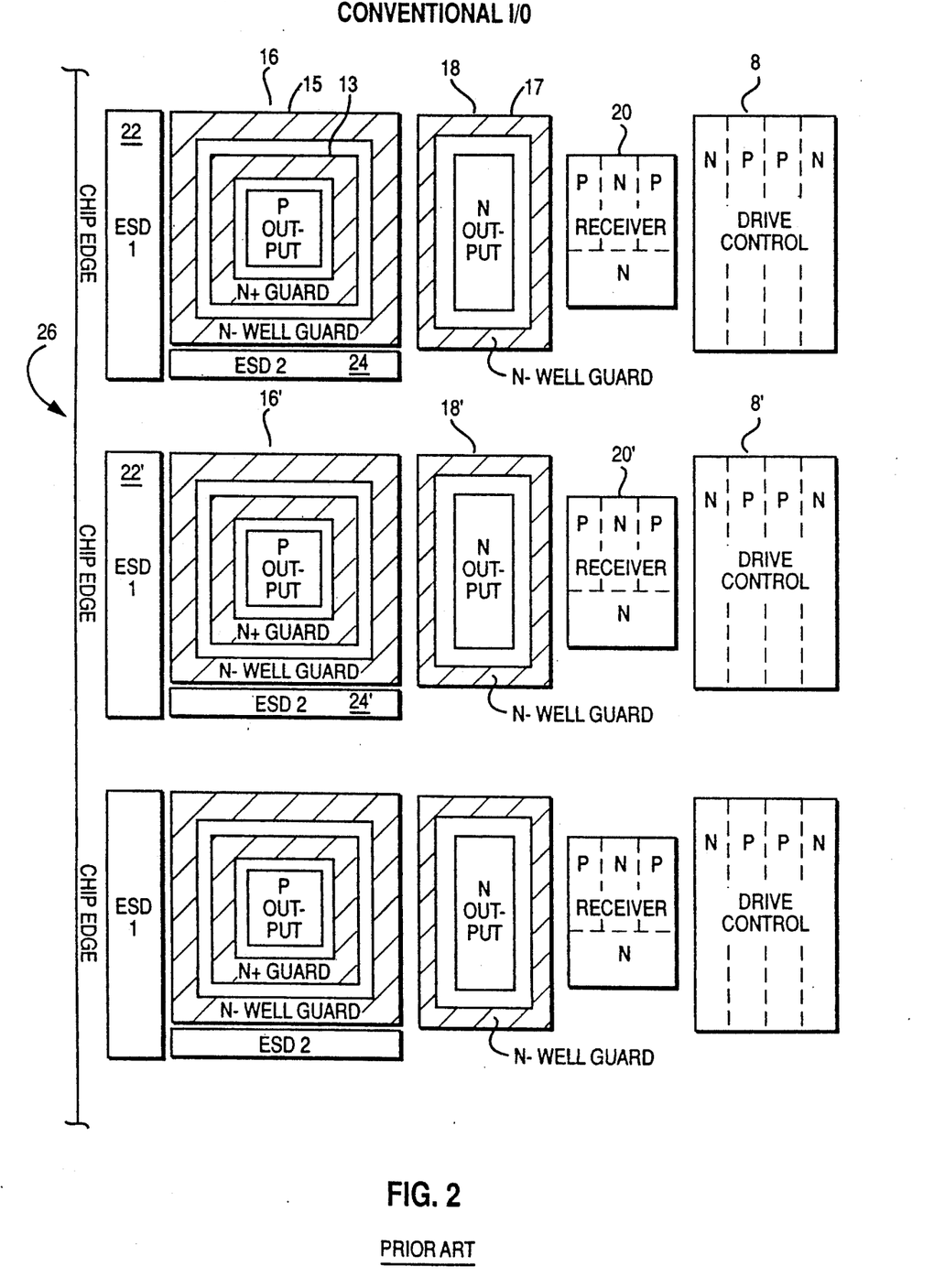
FIG. 2 is a layout diagram for three of the drive and receiver circuits illustrated in FIGS. 1A and 1B using the conventional layout procedures.

A conventional layout of three such input/output circuits as illustrated in schematic form in FIG. 1 (are illustrated in layout form in FIG. 2). The layout of these three input/output circuits is in accordance with the prior art. The typical input/output circuit will be fabricated at the chip edge 26 and consist of the two electrostatic discharge diodes 22 and 24 laid out as shown. Additionally the P channel device 16 is laid out as shown including the two guard rings 15 and 13. Adjacent to the P channel device 16 is the N channel device 18 that includes the guard ring 17. Adjacent to the N channel device 18 is the receiver 20. On the other side of the receiver 20 is located the drive control 8. These devices will be interconnected with a metalization layer not shown. However, similar input/output circuits are laid out in a similar fashion as shown.

Figure 3:
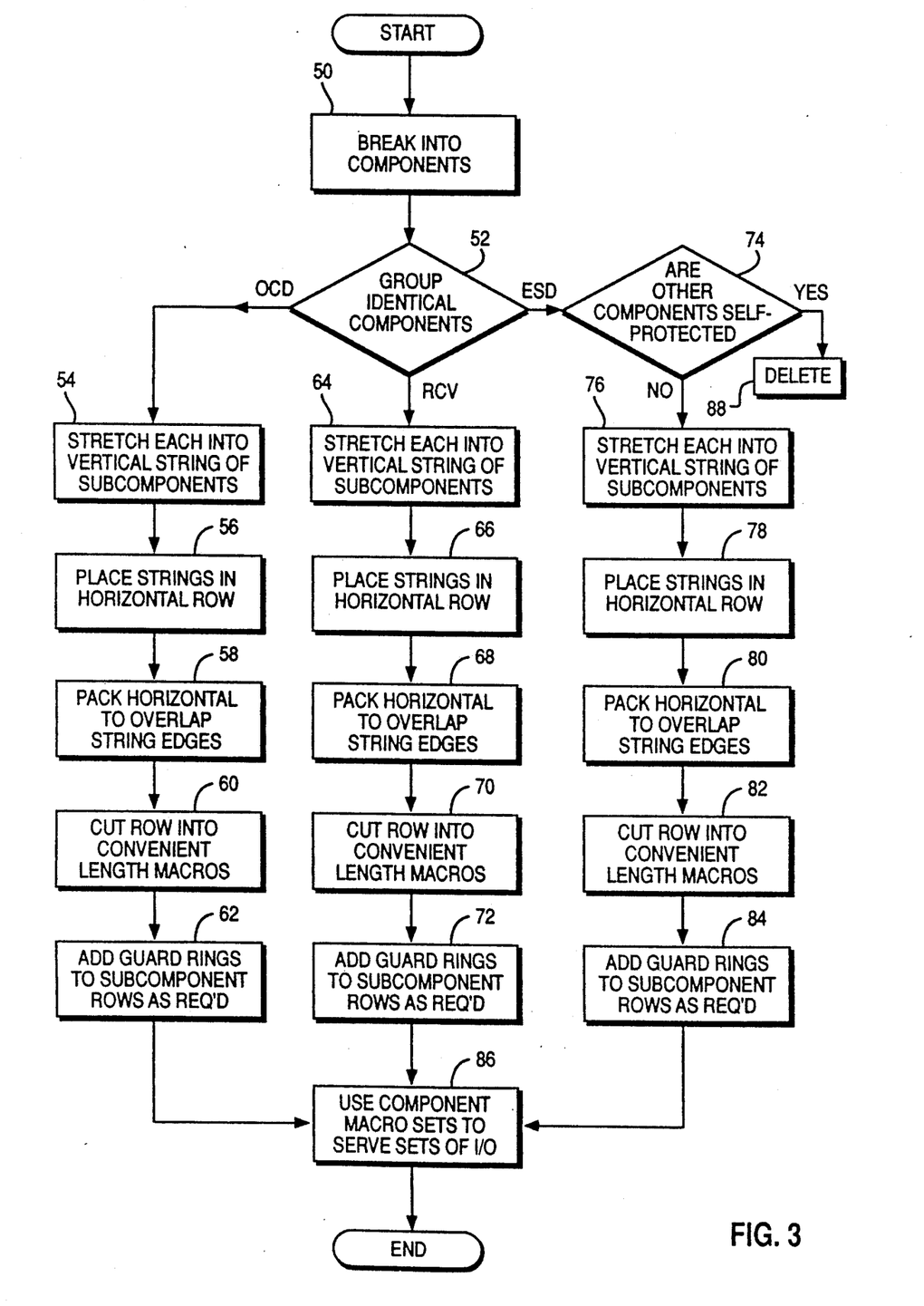
FIG. 3 is a flow chart illustrating the method of the invention for laying out circuit devices.
Figure 4:
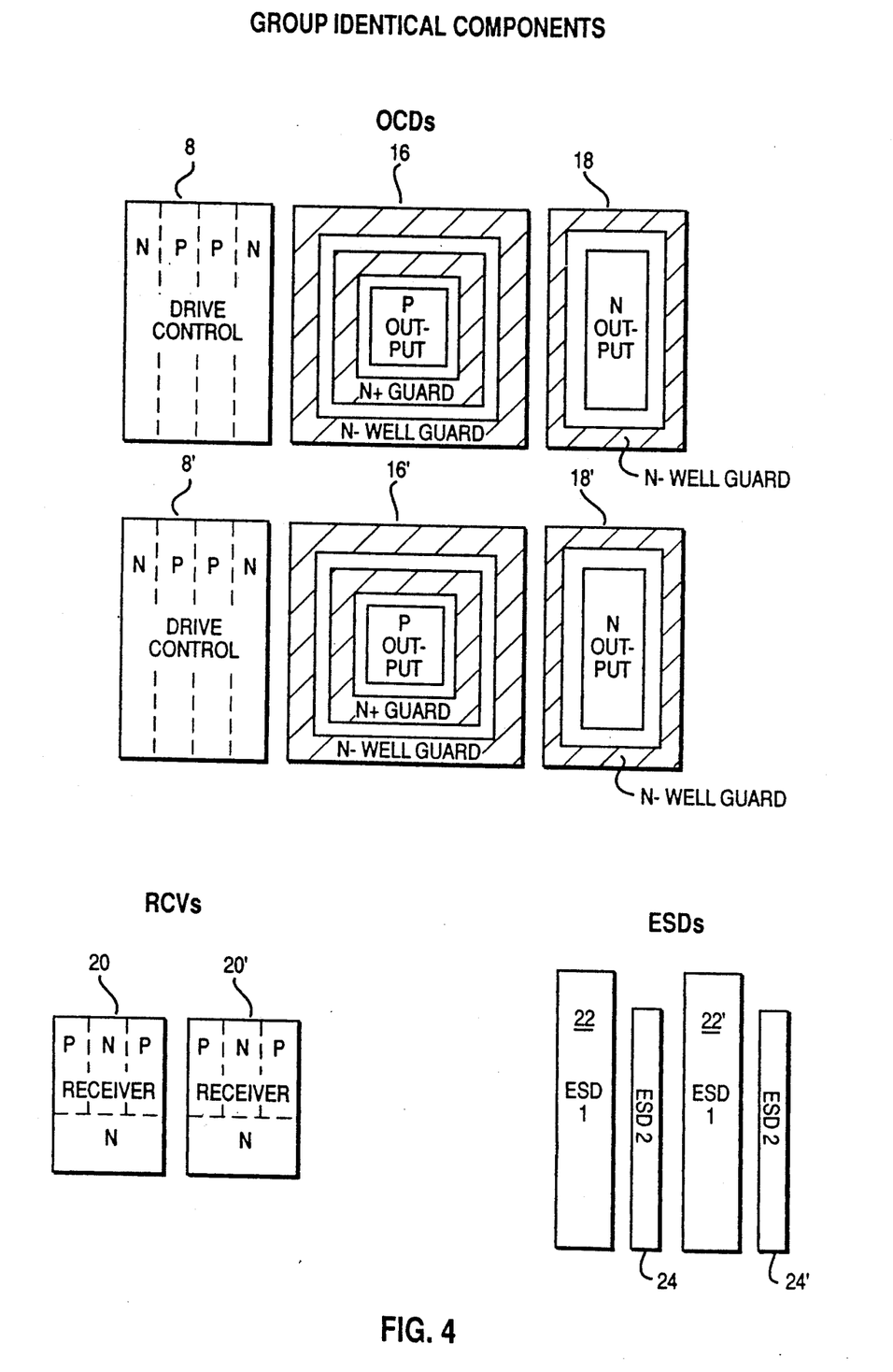
FIG. 4 is an illustration of the step of grouping identical components.

FIG. 3 illustrates the inventive method for providing a more efficient layout of a multiple of input/output circuits on an integrated circuit semiconductor device. In step 50, the total input/output device is divided into components. In input/output circuits there are three basic components, the output control drive circuit (OCD), the electrostatic discharge protection circuit (ESD), and the receiver circuit (RCV). In step 52, the components that are identical are grouped together. In other words all of the driver circuits are grouped (if there were two significant different driver types, two driver groups should be formed), all of the ESD circuits are grouped and all of the receiver circuits are grouped. Then each group is dealt with separately. For example, the drive circuits, receiver circuits and ESD protection circuits are grouped together as shown in FIG. 4. Note that these layouts illustrated in FIG. 4 are similar for the components as illustrated in prior art FIG. 2. However, the location of the components relative to each other has now been changed.

Figure 5:
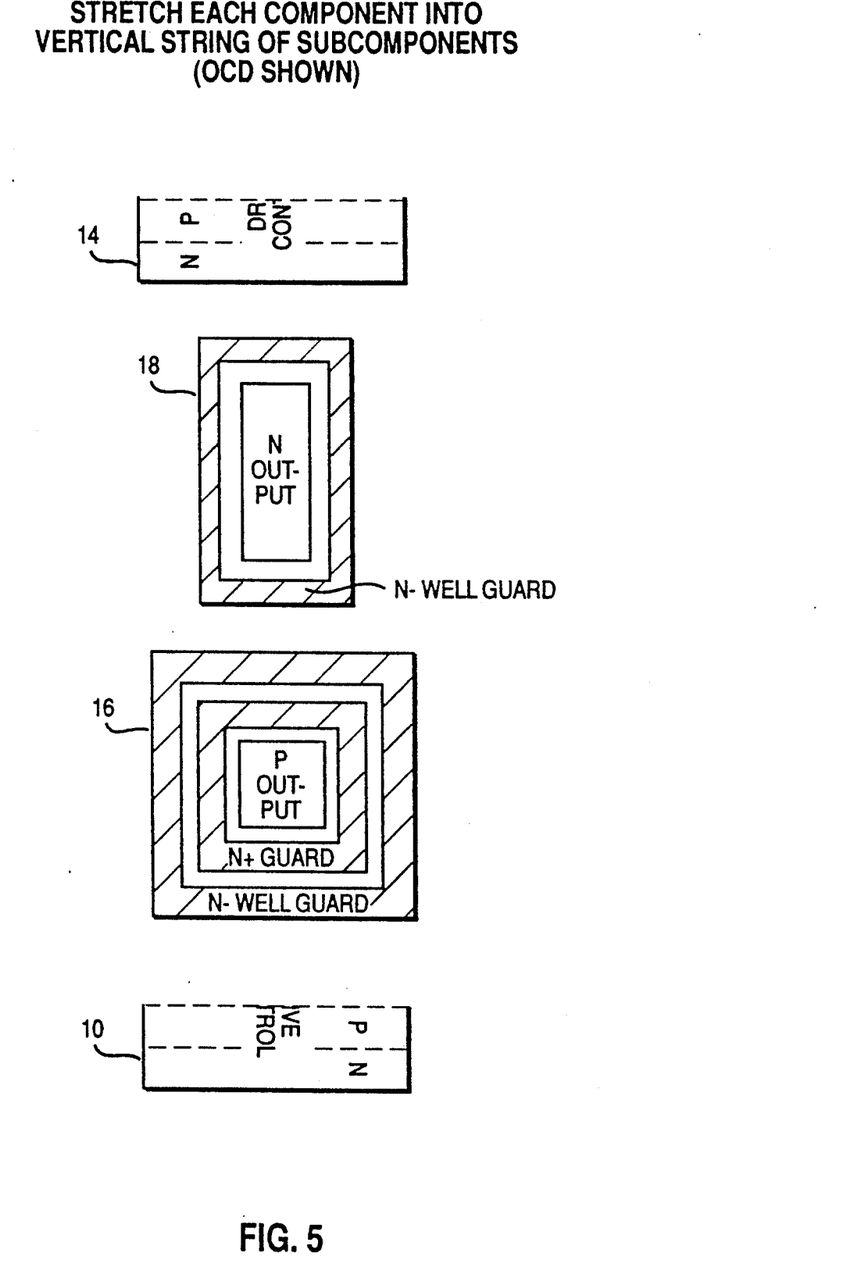
FIG. 5 is an illustration of the step of stretching each of the components into a vertical string of subcomponents.

Taking as an example the drive circuitry, in step 54, the like components are then stretched into a vertical string of subcomponents. An example of this for the drive circuit is illustrated in FIG. 5 where the drive circuit 14 is placed on top of the N channel device 18 which is located on top of the P channel device 16 on top of the drive control circuit 10.

Figure 6:
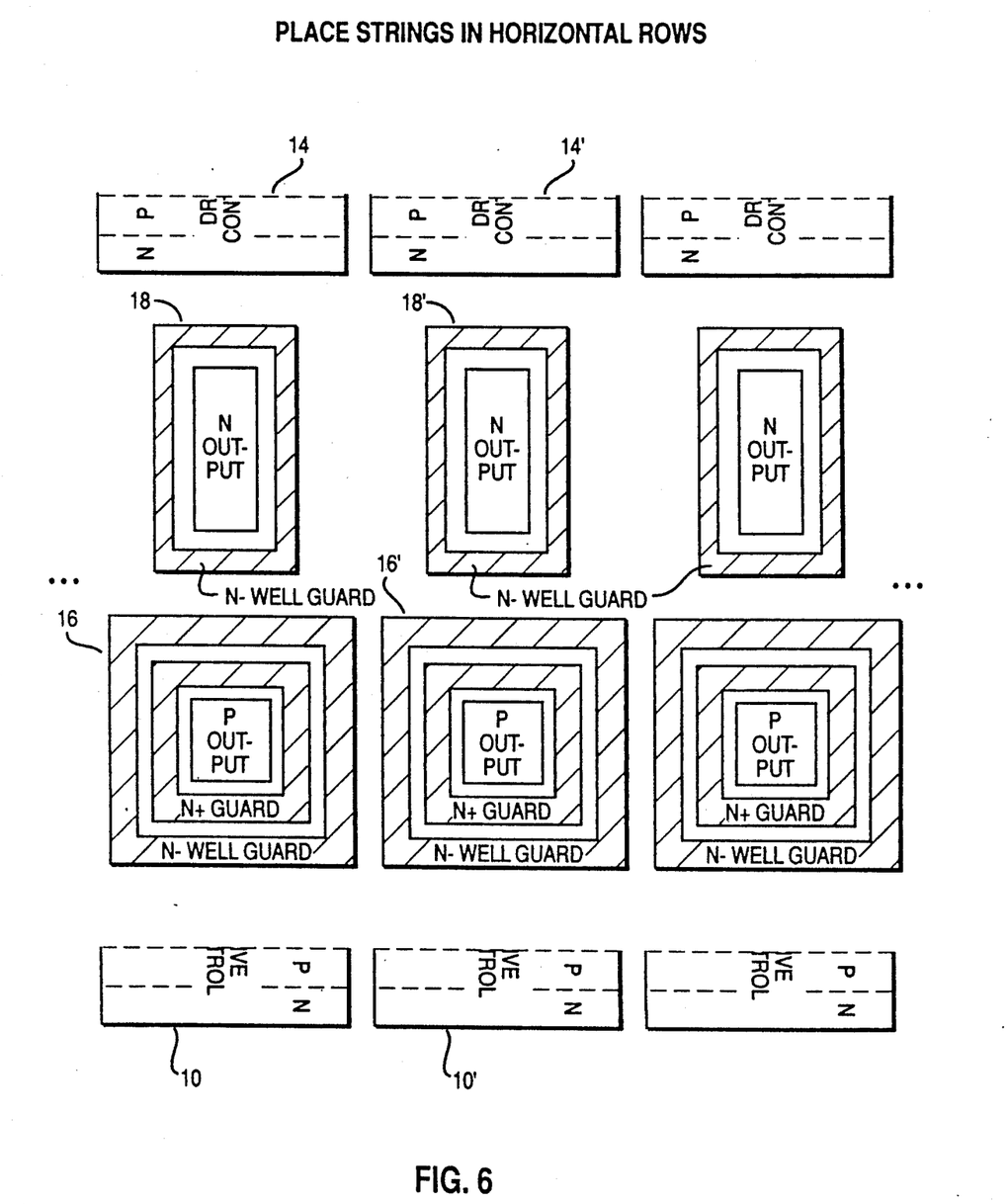
FIG. 6 is an illustration of the step of placing the strings of subcomponents in horizontal rows.

In step 56 (FIG. 3) the strings are placed in horizontal rows. FIG. 6 illustrates this step being performed on three driver components. Note that the like components are placed adjacent to each other. In other words the N channel device 18 is placed adjacent to the like N channel device 18' and another input/output circuit.

Figure 7:
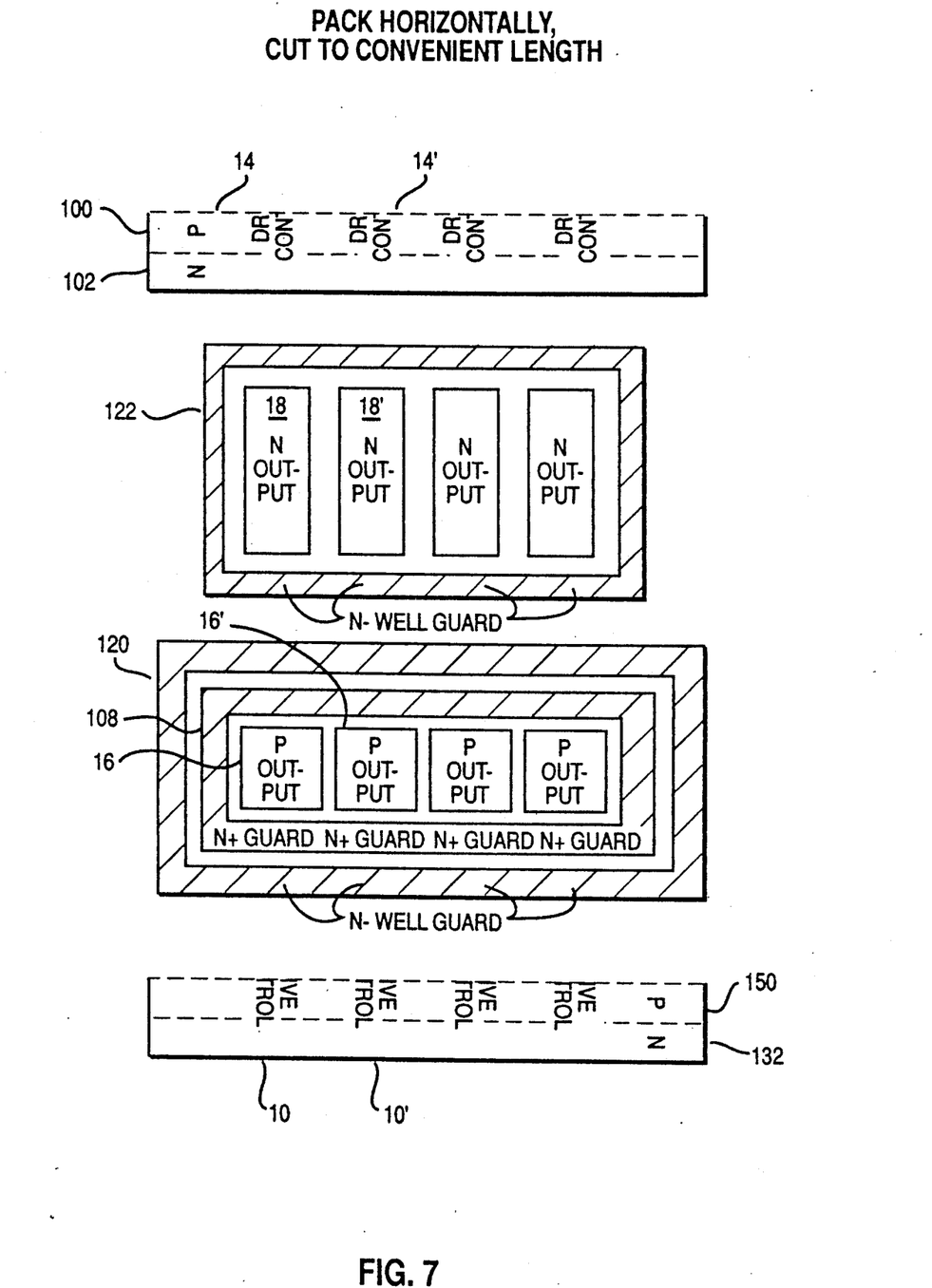
FIG. 7 is an illustration of the two steps of packing the subcomponents horizontally to overlap string edges and the step of cutting the rows into convenient lengths of macro circuits.

In step 56, these circuits are then packed horizontally to overlap their string edges. This is illustrated in FIG. 7. Additionally, in step 60 (FIG. 3), the rows are cut into convenient length of macros. In other words, the like devices once packed horizontally are then cut into macro devices that can be replicated. Both of these steps are illustrated in FIG. 7. The horizontal packing to overlap edges is illustrated as the removal of a single guard ring for the N channel device 18 and placing the N channel device 18 directly adjacent to the N channel device 18' along with the other N channel devices as shown. These N channel devices are able to the placed in close proximity since the layout rules for both are identical and the anti-latch-up constraints on both are similar. (Omitting the interposing ring may allow one driver in latch-up to take a second with it, but even one driver in latch-up is fatal.) All of these devices (4 as illustrated in FIG. 7) are then surrounded by a single guard ring 122. Likewise the P channel devices 16 and 16' are placed in close adjacency and then all of the devices are surrounded by the two guard rings 108 and 120 as opposed to being surrounded by individual guard ring pairs as taught by the prior art. The drive control circuitry 14 and 14' are also placed in close adjacency as illustrated as rows 100 and 102 since the layout rules for both are identical. This would be in the embodiment the drive control NAND gate 14 including the diode 12 (not shown). Likewise the drive control NAND gate 10 would be placed adjacent to the P channel output device 16 as shown.

Figure 8:
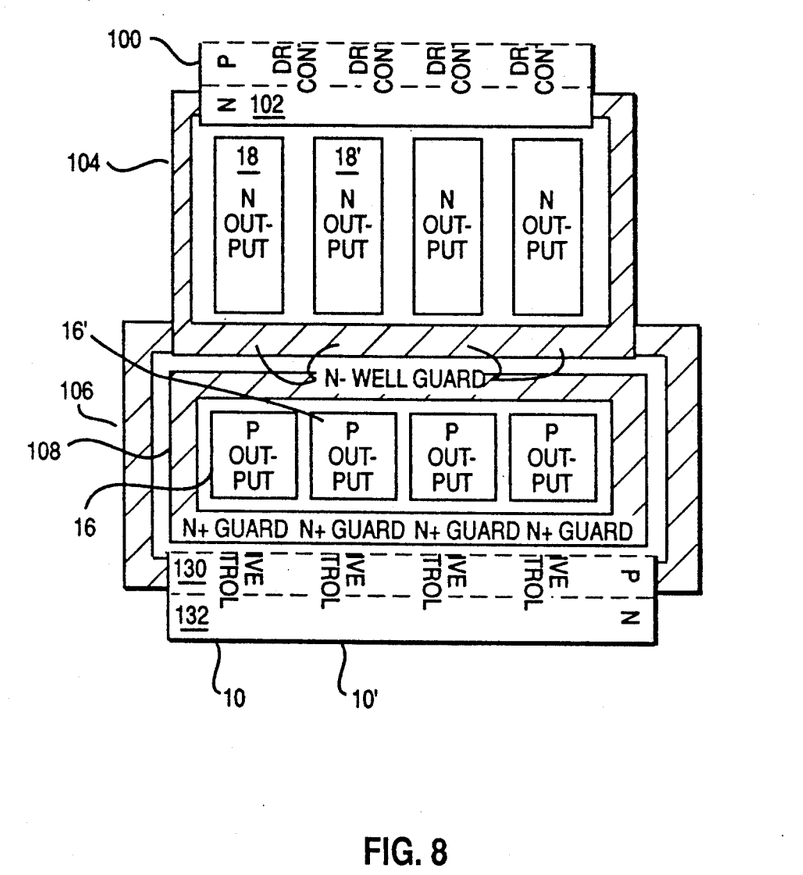
FIG. 8 is an illustration of the step of adding the guard rings.

Step 62 (FIG. 3) provides that the guard rings be added to the subcomponent rows as required. In actuality the guard rings will be made in common and provided as shown in FIG. 8. The guard ring 122 (FIG. 7) now becomes guard ring 104 that extends to the drive control portion 100 and 102 for the N channel device 18 (representing the NAND gate 14 and diode and inverter 12). This guard ring 104 is the same as the guard ring 106 which is surrounding the P channel devices such as P channel device 16 and provides separation in the NAND gate 10 drive control portion consisting of areas 130 and 132. It should be apparent in comparing the guard rings 122, 120 and 108 of FIG. 7, and especially FIG. 6, to the guard ring structure of 104, 106 and 108 of FIG. 8 that a considerable space savings has been achieved by the commonalty of guard rings.

In step 86 then the component macro sets are used to fabricate the required number of input/output circuits. For the receiver circuits, steps 64, 66, 68, 70 and 72 are identical to steps 54, 56, 58, 60 and 62 for the drive circuitry. Therefore these will not be discussed any further.

For the electrostatic discharge device (ESD) protection, step 74 provides that a determination be made if other components are self protected. If these other components are self protected, by means such as internal clamps, then the method according to step 88 deletes all exterior electrostatic discharge protection devices. If, however, the receivers and drivers are not self protected, then the method according to step 76 provides that these components be stretched into vertical strings of subcomponents in a manner similar to that of step 54 for the drive circuitry. Likewise steps 78, 80, 82 and 84 are identical to steps 56, 58, 60 and 62 for the drive circuitry and will not be discussed further. The elements of the drive circuitry do not require separate electrostatic discharge protection because these elements include a self protecting mechanism (see patent application Ser. No. 07/471,893, filed Jan. 29, 1990 herein incorporated by reference) of parasitic transistors.

Figure 9:
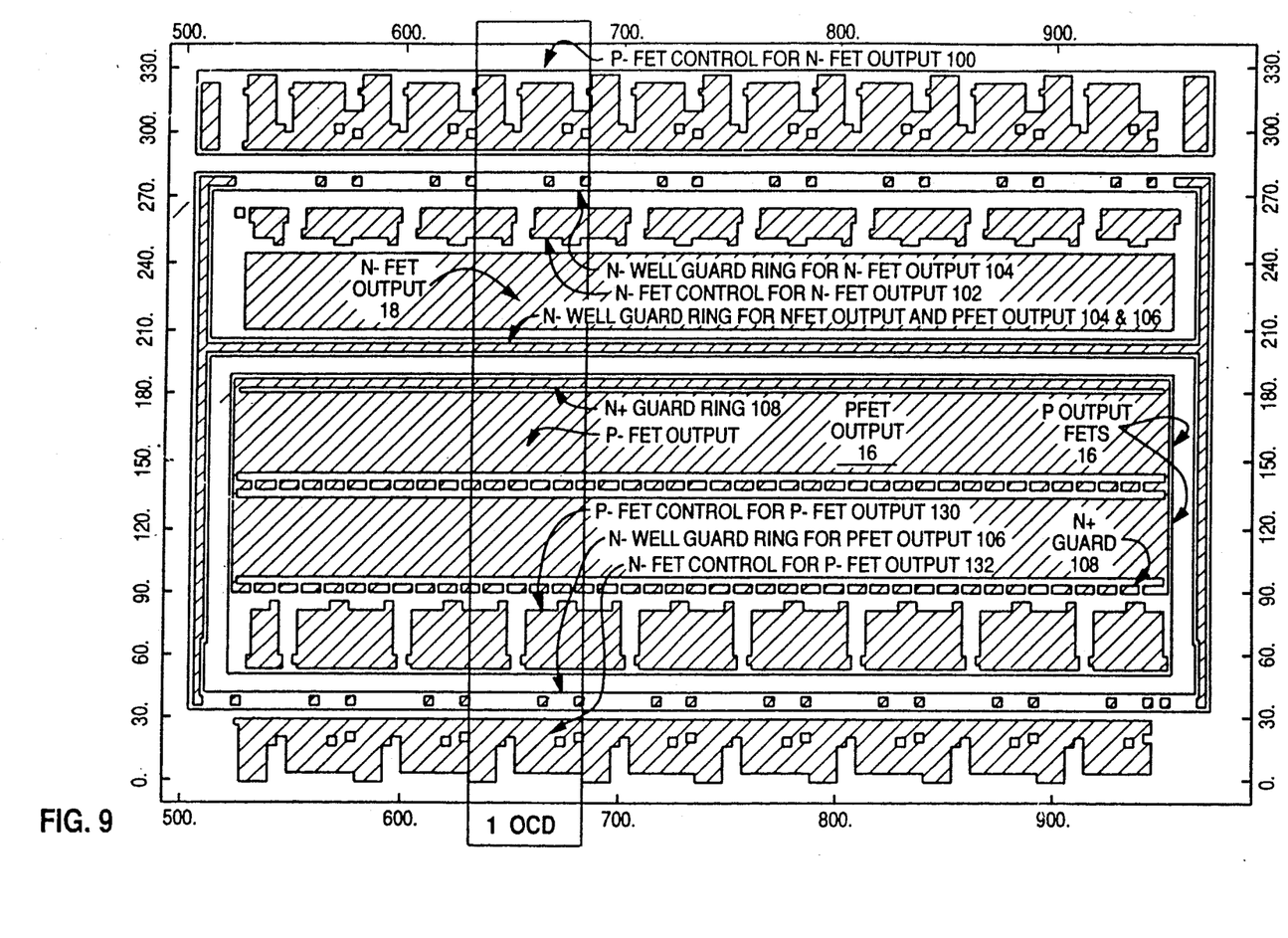
FIG. 9 is an illustration of an actual layout using the invention.

FIG. 9 is an illustration of the actual layout that results from the method of FIG. 3 for a set of OCD's Note that the layout illustrates the P channel output device 16 with the N+ diffusion guard rings 108 and the N-well guard rings 104 and 106. Likewise the control drive circuit 100 and 102 are illustrated with the guard ring 104. The N channel device 18 and P channel device 16 are further illustrated. The P channel control circuitry 130 and 132 are shown at the bottom of FIG. 9.

By using this method integrated circuits may be laid out that include macro sets made up of devices of like fabrication packed closely together and sharing guard rings. In addition, devices having opposite characteristics may be located in adjacency and may share a common guard rings. By using this method, the resulting topological layout of the input/output devices will result in circuitry arranged in bit parallel fashion with the like circuit components adjacent horizontally.

While the invention has been described with reference to the illustrated embodiment, this description is not intended to be construed in a limiting sense. Various modifications of the illustrated embodiment as well as other embodiments of the invention will become apparent to those persons skilled in the art upon reference to this description. It is, therefore, contemplated that these appended claims will cover any such modifications or embodiments as fall within the true scope of this invention.

We claim:

1. A group of input/output circuits on an integrated circuit semiconductor substrate containing other circuits, said input/output circuits comprising:
   a plurality of columns of circuit components, each column representing all input/output circuit components for processing a single data bit in a group of bits;
   a plurality of rows positioned across said columns, each row containing like devices among said input/output circuits; and
   at least one guard ring containing at least one of said plurality of rows.

2. The group of input/output circuits according to claim 1 further including an electrostatic discharge protection circuit device positioned to provide protection for a complete row of devices.

3. The group of input/output circuits according to claim 1 wherein at least two adjacent rows include guard rings containing their respective rows therein and the at least two guard rings share a common guard ring area.

4. A group of input/output circuits on an integrated circuit semiconductor substrate containing other circuits, said input/output circuits comprising;
   a plurality of columns of circuit components, each column representing only input/output circuit components for processing a single data bit in a group of bits;
   a plurality of rows positioned across said columns, each row containing like devices among said input/output circuits; and
   at least one guard ring containing at least one of said plurality of rows.

5. The group of input/output circuits according to claim 4 further including an electrostatic discharge protection circuit device positioned to provide protection for a complete row of devices.

6. The group of input/output circuits according to claim 4 wherein at least two adjacent rows include guard rings containing their respective rows therein and the at least two guard rings share a common guard ring area.

7. A group of input/output circuits on an integrated circuit semiconductor substrate containing other circuits, said input/output circuits comprising;
   a plurality of columns of circuit components, each column representing input/output circuit components for processing a single data bit in a group of bits;
   a plurality of rows positioned across said columns, each row containing like devices among said input/output circuits; and
   at least one guard ring containing at least one of said plurality of rows.

8. The group of input/output circuits according to claim 7 further including an electrostatic discharge protection circuit device positioned to provide protection for a complete row of devices.

9. The group of input/output circuits according to claim 7 wherein at least two adjacent rows include guard rings containing their respective rows therein and the at least two guard rings share a common guard ring area.

10. A group of input/output circuits on an integrated circuit semiconductor substrate containing other circuits, said input/output circuits comprising;
    a plurality of columns of circuit components, each column representing input/output circuit components for processing a single data bit in a group of bits;
    a plurality of rows positioned across said columns, each row containing devices of like function among said input/output circuits; and
    at least one guard ring containing at least one of said plurality of rows.

11. The group of input/output circuits according to claim 10 further including an electrostatic discharge protection circuit device positioned to provide protection for a complete row of devices.

12. The group of input/output circuits according to claim 10 wherein at least two adjacent rows include guard rings containing their respective rows therein and the at least two guard rings share a common guard ring area.

* * * * *